(12) United States Patent
Han et al.

(10) Patent No.: US 11,170,862 B2
(45) Date of Patent: Nov. 9, 2021

(54) MEMORY SYSTEM AND OPERATING METHOD THEREOF

(71) Applicant: SK hynix Inc., Icheon (KR)

(72) Inventors: Mi Seon Han, Icheon (KR); Myoung Seo Kim, Icheon (KR); Eui Cheol Lim, Icheon (KR)

(73) Assignee: SK hynix Inc., Icheon (KR)

( * ) Notice: Subject to any disclaimer, the term of this patent is extended or adjusted under 35 U.S.C. 154(b) by 0 days.

(21) Appl. No.: 16/998,965

(22) Filed: Aug. 20, 2020

(65) Prior Publication Data

US 2021/0295933 A1 Sep. 23, 2021

(30) Foreign Application Priority Data

Mar. 19, 2020 (KR) .................. 10-2020-0033841

(51) Int. Cl.
*G11C 16/04* (2006.01)
*G11C 16/34* (2006.01)
*G11C 16/10* (2006.01)
*G11C 13/00* (2006.01)
*G11C 16/08* (2006.01)
*G11C 16/26* (2006.01)

(52) U.S. Cl.
CPC ...... *G11C 16/3495* (2013.01); *G11C 13/0004* (2013.01); *G11C 16/08* (2013.01); *G11C 16/10* (2013.01); *G11C 16/26* (2013.01)

(58) Field of Classification Search
CPC ...................................................... G11C 29/76
USPC ............................................................ 714/773
See application file for complete search history.

(56) References Cited

U.S. PATENT DOCUMENTS

2012/0226963 A1\* 9/2012 Bivens .................. G11C 29/76
714/773

FOREIGN PATENT DOCUMENTS

KR   1020160121905 A   10/2016

OTHER PUBLICATIONS

Jacobvitz, et al, "Coset Coding to Extend the Lifetime of Memory," 19th IEEE International Symposium on High Performance Computer Architecture, 2007, 12 pages.

\* cited by examiner

*Primary Examiner* — Jason Lappas

(57) ABSTRACT

A memory system includes a non-volatile memory device and a controller. The non-volatile memory device includes a plurality of memory regions, each memory region including a plurality of cells commonly coupled to a word line. The controller generates a plurality of candidate data sets based on source data, determines a number of vulnerable cells corresponding to each of the plurality of candidate data sets, and stores a candidate data set having a smallest number of vulnerable cells into a target memory region among the plurality of memory regions.

19 Claims, 6 Drawing Sheets

:WRITE DISTURBANCE

| | | CDT | WTCN | WACN | WCN | |
|---|---|---|---|---|---|---|
| SDT | | CDT1 | 50 | 35 | 85 | |
| | | CDT2 | 15 | 25 | 40 | ~SCDT |
| | | ⋮ | ⋮ | ⋮ | ⋮ | |
| | | CDTk | 30 | 60 | 90 | |

MEMORY SYSTEM AND OPERATING METHOD THEREOF

CROSS-REFERENCES TO RELATED APPLICATION

The present application claims priority under 35 U.S.C. § 119(a) to Korean application number 10-2020-0033841, filed on Mar. 19, 2020, in the Korean Intellectual Property Office, which is incorporated herein by reference in its entirety as set forth in full.

BACKGROUND

1. Technical Field

Various embodiments generally relate to a memory system, and more particularly, to a memory system including a nonvolatile memory device.

2. Related Art

A memory system may be configured to store, in response to a write request from a host device, data provided from the host device. Also, the memory system may be configured to provide, in response to a read request from the host device, data stored therein to the host device. The host device may be an electronic device capable of processing data and may include a computer, a digital camera, a mobile phone and so forth. The memory system may be provided within the host device or may be manufactured as detachable from the host device. The memory system may be operable when coupled to the host device.

SUMMARY

Various embodiments of the present disclosure provide a memory system having improved data reliability by reducing an error due to a write disturbance effect, and an operating method thereof. Write disturbance is the corruption of data in one location caused by writing of data at another location.

In accordance with an embodiment, a memory system may include a non-volatile memory device including a plurality of memory regions, each memory region including a plurality of cells commonly coupled to a word line; and a controller configured to: generate a plurality of candidate data sets based on source data, determine a respective number of vulnerable cells corresponding to each of the plurality of candidate data sets, select, from the plurality of candidate data sets, a candidate data set having a smallest number of vulnerable cells, and store the selected candidate data set into a target memory region among the plurality of memory regions.

In accordance with an embodiment, a memory system may include a phase-change memory device including a plurality of memory regions; and a controller configured to: generate a candidate data set based on source data, determine a number of vulnerable cells corresponding to the candidate data set based on a target data set that is read from a target memory region among the plurality of memory regions, at least one neighbouring data set read from at least one neighbouring memory region and the candidate data set, and selectively store the candidate data set into the target memory region based on the number of vulnerable cells.

In accordance with an embodiment, a method of operating a memory system including a non-volatile memory device including a plurality of memory regions each including a plurality of cells commonly coupled to a word line may include generating, by a controller, a plurality of candidate data sets based on source data; determining, by the controller, a respective number of vulnerable cells corresponding to each of the plurality of candidate data sets; and storing, by the controller, a candidate data set having a smallest number of vulnerable cells into a target memory region among the plurality of memory regions.

In accordance with an embodiment, the memory system and the operating method thereof may improve data reliability by reducing occurrence of an error due to a write disturbance effect.

BRIEF DESCRIPTION OF THE DRAWINGS

Features, aspects and embodiments are described in conjunction with the attached drawings, in which.

DETAILED DESCRIPTION

Illustrative embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

The drawings are not necessarily to scale and, in some instances, proportions may have been exaggerated in order to clearly illustrate features of the embodiments. The terminology used herein is for the purpose of describing particular embodiments only and is not intended to be limiting of the invention.

As used herein, the term "and/or" includes at least one of the associated listed items. It will be understood that when an element is referred to as being "connected to", or "coupled to" another element, it may be directly on, connected to, or coupled to the other element, or one or more intervening elements may be present. As used herein, singular forms are intended to include the plural forms and vice versa, unless the context clearly indicates otherwise. It will be further understood that the terms "comprises," "comprising," "includes," and "including" when used in this specification, specify the presence of the stated elements and do not preclude the presence or addition of one or more other elements.

Hereinafter, illustrative embodiments of the present disclosure will be described below with reference to the accompanying drawings.

Figure 1:
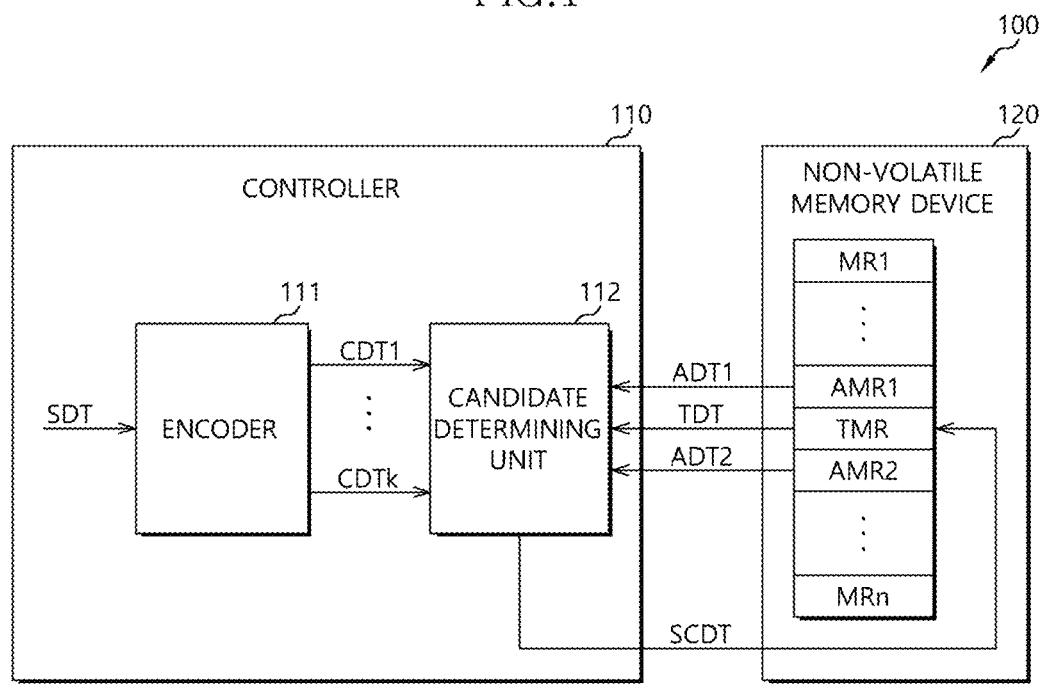
FIG. 1 illustrates a memory system in accordance with an embodiment.

FIG. 1 is a block diagram illustrating a memory system 100 in accordance with an embodiment.

Referring to FIG. 1, the memory system 100 may be configured to store, in response to a write request from an external host device (not illustrated), data provided from the host device. Also, the memory system 100 may be configured to provide, in response to a read request from the host device, data stored therein to the host device.

The memory system 100 may include a Personal Computer Memory Card International Association (PCMCIA) card, a Compact Flash (CF) card, a smart media card, a memory stick, various multimedia card (MMC, eMMC, RS-MMC and MMC-micro), a Secure Digital (SD) card (SD, Mini-SD and Micro-SD), a Universal Flash Storage (UFS) device, a Solid State Drive (SSD), or the like.

The memory system 100 may include a controller 110 and a non-volatile memory device 120.

The controller 110 may control a general operation of the memory system 100. The controller 110 may control the non-volatile memory device 120 in order to perform a foreground operation in response to a request from the host device. Foreground operations may include writing data in the non-volatile memory device 120 and reading data from the non-volatile memory device 120 in response to respective requests (e.g., a write request and a read request) from the host device.

The controller 110 may control the non-volatile memory device 120 in order to perform background operations independent of the host device. The background operations may include at least one among a wear leveling operation, a garbage collection operation, an erase operation, a read reclaim operation, and a refresh operation on the non-volatile memory device 120. Like the foreground operations, the background operations may include an operation of writing data in the non-volatile memory device 120 and reading data from the non-volatile memory device 120.

The controller 110 may convert source data SDT, which the controller 110 is requested by the host device to store into the non-volatile memory device 120, into adequate data (such as a selected candidate data set SCDT as described below) in which there occur a small number of errors, and store the adequate data into a target memory region TMR.

Particularly, the controller 110 may include an encoder 111 and a candidate determining unit 112.

The encoder 111 may generate a plurality of candidate data sets CDT1 to CDTk based on the source data SDT. For example, in an embodiment, the encoder 111 may encode the source data SDT according to coset coding to generate the plurality of candidate data sets CDT1 to CDTk, but embodiments are not limited thereto.

The candidate determining unit 112 may select the candidate data set SCDT from among the plurality of candidate data sets CDT1 to CDTk generated by the encoder 111, the candidate data set SCDT being the data set to be stored in the target memory region TMR. The candidate determining unit 112 may select as the candidate data set SCDT the candidate data set that causes the fewest potential write disturbance effects from among the plurality of candidate data sets CDT1 to CDTk.

Particularly, the candidate determining unit 112 may determine a number of vulnerable cells corresponding to each of the plurality of candidate data sets CDT1 to CDTk and may select as the candidate data set SCDT one of the plurality of candidate data sets CDT1 to CDTk corresponding to the smallest number of vulnerable cells. The number of vulnerable cells corresponding to each of the plurality of candidate data sets CDT1 to CDTk may be a number of cells that might be affected by the write disturbance effect in the target memory region TMR and in neighbouring memory regions AMR1 and AMR2 neighbouring the target memory region TMR when storing each of the plurality of candidate data sets CDT1 to CDTk in the target memory region TMR. Whether a cell is a vulnerable cell may depend on both a value in that the cell and a value being written into one or more adjacent cells, as explained below.

Particularly, for each of the plurality of candidate data sets CDT1 to CDTk, the candidate determining unit 112 may determine a number of vulnerable target cells within the target memory region TMR, may determine a number of vulnerable neighbouring cells within the neighbouring memory regions AMR1 and AMR2, and may determine as the number of vulnerable cells a sum of the numbers of the vulnerable target cells and the vulnerable neighbouring cells.

For each of the plurality of candidate data sets CDT1 to CDTk, the candidate determining unit 112 may determine as the number of vulnerable cells a number of reset-kept cells neighbouring reset-programmed cells among target cells within the target memory region TMR. Whether a cell among the target cells is a reset-kept cell, a reset-programmed cell, or neither may depend on the candidate data set being analyzed and on the present value of the cell.

A reset-programmed cell may be a target cell a status of which would change from a set status to a reset status when storing the candidate data set being analyzed into the target memory region TMR. A cell of the reset status may have a higher resistance value than a cell of the set status. For example, a cell of the reset status may be storing a value of "0" and a cell of the set status may be storing a value of "1".

A reset-kept cell may be a target cell which would be kept in the reset status when storing the candidate data set being analyzed into the target memory region TMR.

The candidate determining unit 112 may determine the respective number of vulnerable target cells of each of the plurality of candidate data sets CDT1 to CDTk based on the corresponding candidate data set and a target data set TDT, which is read from the target memory region TMR.

For each of the plurality of candidate data sets CDT1 to CDTk, the candidate determining unit 112 may determine, as the number of vulnerable neighbouring cells, a number of neighbouring cells of the reset status and neighbouring the reset-programmed cells within the target memory region TMR among neighbouring cells within the neighbouring memory regions AMR1 and AMR2. The candidate determining unit 112 may determine the number of vulnerable neighbouring cells of each of the plurality of candidate data sets CDT1 to CDTk based on the target data set TDT read from the target memory region TMR, neighbouring data sets ADT1 and ADT2 read from the neighbouring memory regions AMR1 and AMR2, and the corresponding candidate data set.

The candidate determining unit 112 may store, into a memory within the candidate determining unit 112 or a separate memory, the plurality of candidate data sets CDT1 to CDTk received from the encoder 111 until the candidate data set SCDT is selected.

The controller 110 may further include a decoder (not illustrated). When the candidate data set SCDT stored in the target memory region TMR is subsequently read from the target memory region TMR, the decoder may decode the candidate data set SCDT to recover the source data SDT. For example, the decoder may perform the decoding operation according to the coset coding.

According to the control of the controller 110, the non-volatile memory device 120 may store data (e.g., the selected candidate data set SCDT) provided from the controller 110 and may read stored data to provide the read data to the controller 110. The non-volatile memory device 120 may include a plurality of memory regions MR1 to MRn. Each of the plurality of memory regions MR1 to MRn may be a unit by which the non-volatile memory device 120 performs a program operation or a read operation. Each of the plurality of memory regions MR1 to MRn may be coupled to a word line and may include a plurality of cells respectively coupled to different bit lines.

The neighbouring memory regions AMR1 and AMR2 may be respectively coupled to word lines neighbouring a word line coupled to the target memory region TMR.

FIG. 1 illustrates an example having two neighbouring memory regions AMR1 and AMR2 adjacent to the target memory region TMR. However, in embodiments, the target memory region TMR may be adjacent to one neighbouring memory region or three or more neighbouring memory regions.

In an embodiment, the non-volatile memory device 120 may include a Phase-Change Random Access Memory (PCRAM), but embodiments are not limited thereto. In embodiments, the non-volatile memory device 120 may include a flash memory device such as a NAND flash or a NOR flash, a Ferroelectrics Random Access Memory (Fe-RAM), a Magnetic Random Access Memory (MRAM), or a Resistive Random Access Memory (ReRAM).

The non-volatile memory device 120 may include one or more planes, one or more memory chips, one or more memory dies, or one or more memory packages.

FIG. 1 illustrates the memory system 100 including one non-volatile memory device 120. However, a number of non-volatile memory devices included in the memory system 100 will not be limited thereto.

Figure 2:
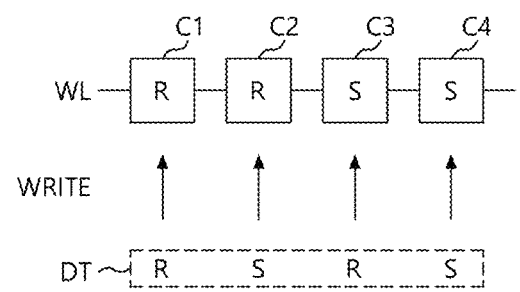
FIG. 2 illustrates a program operation of the non-volatile memory device of FIG. 1 in accordance with an embodiment.

FIG. 2 is a diagram illustrating a program operation of the non-volatile memory device 120 of FIG. 1 in accordance with an embodiment.

Referring to FIG. 2, cells C1 to C4 may be commonly coupled to a word line WL and may be respectively coupled to different bit lines (not illustrated). Before the program operation, the cells C1 and C2 may be in the reset status R and the cells C3 and C4 may be in the set status S. The cells C1 and C2 of the reset status R may have higher resistance values than the cells C3 and C4 of the set status S. For example, the cells C1 and C2 of the reset status R may be storing a value of "0" and the cells C3 and C4 of the set status S may be storing a value of "1". However, the values stored in the cells of the reset status R and the set status S will not be limited thereto.

In the illustrated situation, the non-volatile memory device 120 may receive a write command for storing a data set DT into the cells C1 to C4. The cells C1 to C4 may become target cells of a program operation in response to the write command.

In this case, the non-volatile memory device 120 may apply a set program pulse to the target cell C2 in order to change the status of the target cell C2 from the reset status R to the set status S. At the same time, the non-volatile memory device 120 may apply a reset program pulse to the target cell C3 in order to change the status of the target cell C3 from the set status S to the reset status R. However, the non-volatile memory device 120 may not apply program pulses to the target cells C1 and C4 in order to maintain the statuses of the target cells C1 and C4 as the reset status R and the set status S, respectively.

In the following disclosure, a reset-programmed cell may be a target cell, the status of which is to be changed from the set status S to the reset status R by a program operation. Therefore, the target cell C3 may be the reset-programmed cell.

In the following disclosure, a set-programmed cell may be a target cell, the status of which is to be changed from the reset status R to the set status S by a program operation. Therefore, the target cell C2 may be the set-programmed cell.

In the following disclosure, a reset-kept cell may be a target cell that is to be kept in the reset status R during a program operation. Therefore, the target cell C1 may be the reset-kept cell.

In the following disclosure, a set-kept cell may be a target cell that is to be kept in the set status S during a program operation. Therefore, the target cell C4 may be the set-kept cell.

Figures 3, 4:
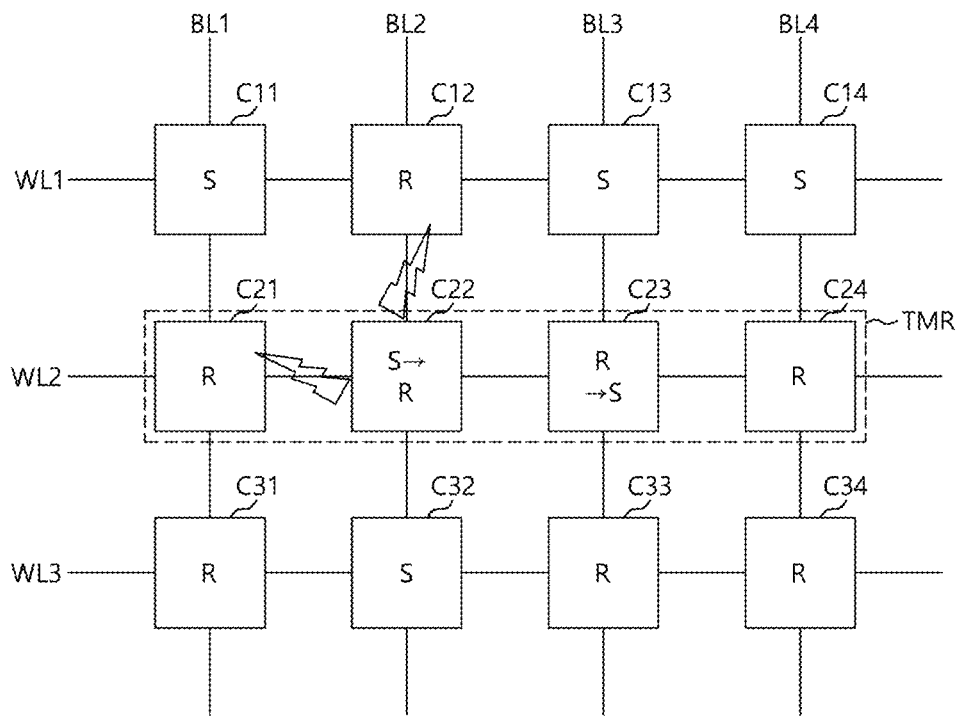
FIG. 3 illustrates cells affected by a write disturbance in a program operation.
FIG. 4 illustrates an operating process of the controller of FIG. 1 in accordance with an embodiment.

FIG. 3 is a diagram illustrating cells C12 and C21 affected by a write disturbance during a program operation.

Referring to FIG. 3, cells C11 to C14 may be commonly coupled to a word line WL1 and may be respectively coupled to bit lines BL1 to BL4 that are adjacent to each other. Cells C21 to C24 may be commonly coupled to a word line WL2 adjacent to the word line WL1 and may be respectively coupled to the bit lines BL1 to BL4. Cells C31 to C34 may be commonly coupled to a word line WL3 adjacent to the word line WL2 and may be respectively coupled to the bit lines BL1 to BL4.

When cells are commonly coupled to a word line and respectively coupled to neighbouring bit lines or when cells are respectively coupled to neighbouring word lines and commonly coupled to a bit line, the cells may be referred to as neighbouring cells. For example, the cell C22 may be a neighbouring cell of each of the cells C12, C21, C23, and C32.

The cells C21 to C24 may be included in the target memory region TMR of a program operation. In this case, although not illustrated, the cells C11 to C14 may be included in the neighbouring memory region AMR1 of FIG. 1 and the cells C31 to C34 may be included in the neighbouring memory region AMR2 of FIG. 1.

Before a program operation is performed, the target cells C12, C21, C23, C24, C31, C33, and C34 may be in the reset status R and the target cells C11, C13, C14, C22, and C32 may be in the set status S. In the program operation, the target cells C21 and C24 may be the reset-kept cells, the target cell C22 may be the reset-programmed cell (as indicated in FIG. 3 by 'S→R'), and the target cell C23 may be the set-programmed cell (as indicated in FIG. 3 by 'R→S').

In this case, when a reset program pulse is applied to the target cell C22, the write disturbance effect may affect the target cells C12 and C21. Due to the write disturbance effect, the statuses of the target cells C12 and C21 may change from the reset status R to the set status S. That is, although the target cells C12 and C21 should be kept in the reset status R, the statuses of the target cells C12 and C21 may change from the reset status R to the set status S and therefore the target cells C12 and C21 may store error bits.

To sum up, the write disturbance effect in a program operation may affect the reset-kept cell C21 adjacent to the reset-programmed cell C22 among the target cells C21 to C24. Also, the write disturbance effect may affect, among the neighbouring cells C11 to C14 and C31 to C34, the target cell C12 in the reset status R and adjacent to the reset-programmed cell C22. In the illustrated embodiment, the programming of a reset-programmed cell may have write disturbance effects on neighbouring reset-kept and reset-status cells, but embodiments are not limited thereto; for example, in other embodiments, set-programmed cells may have write disturbance effects on neighbouring cells, neighbouring set-kept and set-status cells may be affected by write disturbance effects, or both.

FIG. 4 is a diagram illustrating an operating process of the controller 110 of FIG. 1 in accordance with an embodiment.

Referring to FIG. 4, the encoder 111 may generate the plurality of candidate data sets CDT1 to CDTk based on the source data SDT. The plurality of candidate data sets CDT1 to CDTk may be provided to the candidate determining unit 112.

For each of the plurality of candidate data sets CDT1 to CDTk, the candidate determining unit 112 may determine a number of vulnerable target cells WTCN and may determine a number of vulnerable neighbouring cells WACN. For each of the plurality of candidate data sets CDT1 to CDTk, the candidate determining unit 112 may determine a sum of the number of vulnerable target cells WTCN and the number of vulnerable neighbouring cells WACN as a number of vulnerable cells WCN. For example, in FIG. 3, cell C21 may be a vulnerable target cell, and cell C12 may be a vulnerable neighbouring cell.

The candidate determining unit 112 may select a candidate data set (in this example, the candidate data set CDT2) having the smallest number of vulnerable cells WCN among the plurality of candidate data sets CDT1 to CDTk as the selected candidate data set SCDT. The controller 110 may store the selected candidate data set SCDT into the target memory region TMR.

In an embodiment, the candidate determining unit 112 may select a candidate data set having the number of vulnerable cells WCN less than a threshold as the selected candidate data set SCDT to store into the target memory region TMR. The threshold may depend on an error-correction capability of the controller 110.

Figure 5:
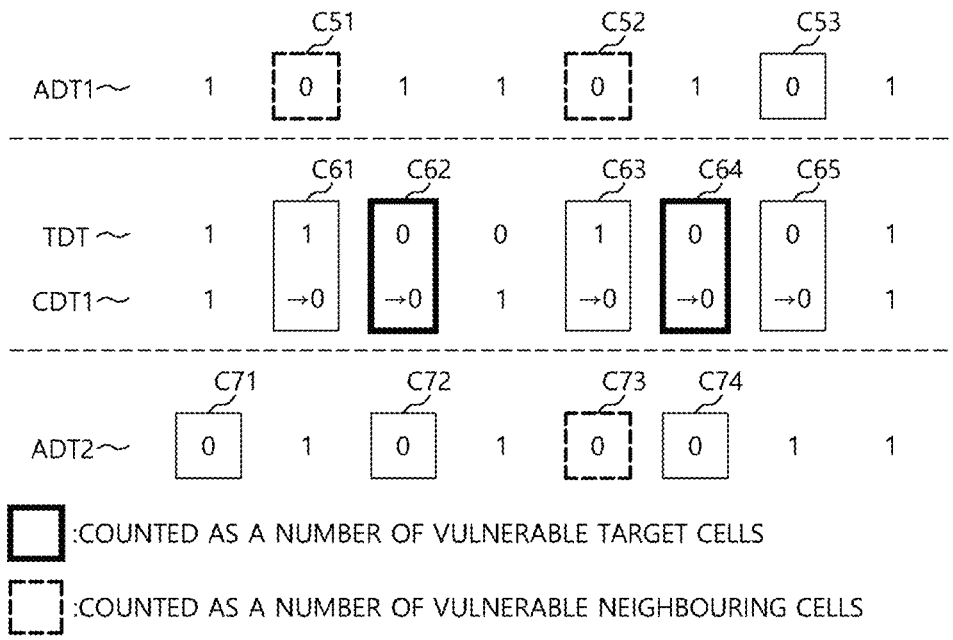
FIG. 5 illustrates an example candidate determining unit determining a number of vulnerable target cells and a number of vulnerable neighbouring cells of a first candidate data set in accordance with an embodiment.

FIG. 5 is a diagram illustrating an example of the candidate determining unit 112 determining the number of vulnerable target cells WTCN and the number of vulnerable neighbouring cells WACN of a first candidate data set CDT1 in accordance with an embodiment.

Referring to FIG. 5, the candidate determining unit 112 may read the target data set TDT from the target memory region TMR, may read a first neighbouring data set ADT1 from the neighbouring memory region AMR1, and may read a second neighbouring data set ADT2 from the neighbouring memory region AMR2. A value of "0" may be read from a cell of the reset status and a value of "1" may be read from a cell of the set status.

The candidate determining unit 112 may determine, based on the target data set TDT and the first candidate data set CDT1, the reset-programmed cells C61 and C63 among the target cells. That is, the target cells C61 and C63 that are currently storing a value of "1" and are going to store a value of "0" after a program operation with the first candidate data set CDT1 may be the reset-programmed cells corresponding to the first candidate data set CDT1.

The candidate determining unit 112 may count, as the number of vulnerable target cells WTCN, the reset-kept cells C62 and C64 adjacent to the reset-programmed cells C61 and C63. That is, the target cells C62, C64, and C65 that are currently storing a value of "0" and are going to keep storing a value of "0" even after a program operation may be the reset-kept cells. Therefore, the candidate determining unit 112 may count the target cells C62 and C64 as the number of vulnerable target cells WTCN. The reset-kept cell C65 may not be adjacent to the reset-programmed cells C61 and C63. Therefore, the candidate determining unit 112 may not count the reset-kept cell C65 as the number of vulnerable target cells WTCN.

Based on the target data set TDT, the first candidate data set CDT1, and the first neighbouring data set ADT1, the candidate determining unit 112 may count, as the number of vulnerable neighbouring cells WACN, the neighbouring cells C51 and C52 in the reset status and adjacent to the reset-programmed cells C61 and C63 among the neighbouring cells within the neighbouring memory region AMR1.

Based on the target data set TDT, the first candidate data set CDT1, and the second neighbouring data set ADT2, the candidate determining unit 112 may also count, as the number of vulnerable neighbouring cells WACN, the neighbouring cell C73 in the reset status and adjacent to the reset-programmed cells C61 and C63 among the neighbouring cells within the neighbouring memory region AMR2.

The candidate determining unit 112 may not count the neighbouring cells C53, C71, C72, and C74 in the reset status as the number of vulnerable neighbouring cells WACN since the neighbouring cells C53, C71, C72, and C74 are not adjacent to either of the reset-programmed cells C61 and C63.

The candidate determining unit 112 may determine the number of vulnerable target cells WTCN and the number of vulnerable neighbouring cells WACN for each of remaining candidate data sets CDT2 to CDTk in the same way as described with reference to FIG. 5.

Therefore, in accordance with an embodiment, errors introduced due to the write disturbance effect may be reduced and data reliability of the memory system 100 may be improved.

Figure 6:
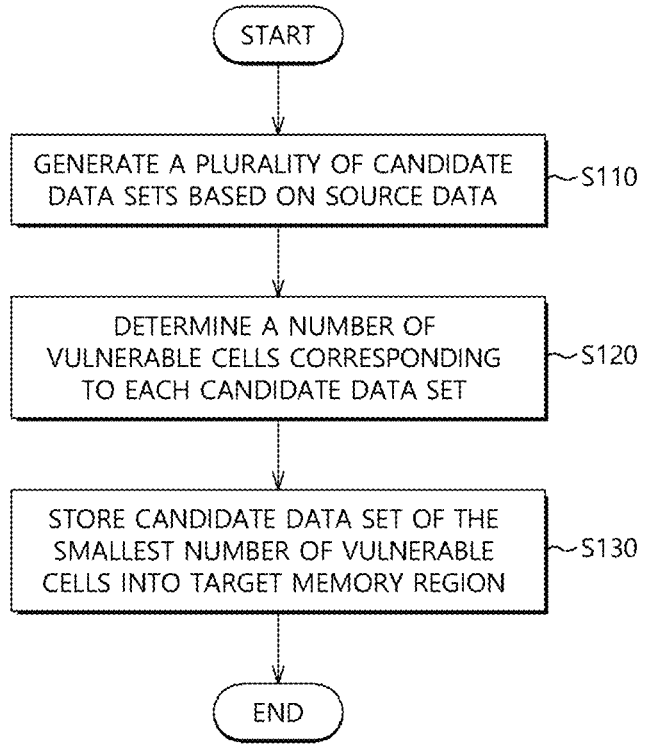
FIG. 6 illustrates an operating process of the controller of FIG. 1 in accordance with an embodiment.

FIG. 6 is a flowchart illustrating an operating process of the controller 110 of FIG. 1 in accordance with an embodiment.

Referring to FIG. 6, in step S110, the controller 110 may generate the plurality of candidate data sets CDT1 to CDTk based on the source data SDT.

In step S120, the controller 110 may determine the number of vulnerable cells WCN corresponding to each of the plurality of candidate data sets CDT1 to CDTk.

In step S130, the controller 110 may select the candidate data set SCDT having the smallest number of vulnerable cells WCN among the plurality of candidate data sets CDT1 to CDTk and store the selected candidate data set SCDT into the target memory region TMR.

Figure 7:
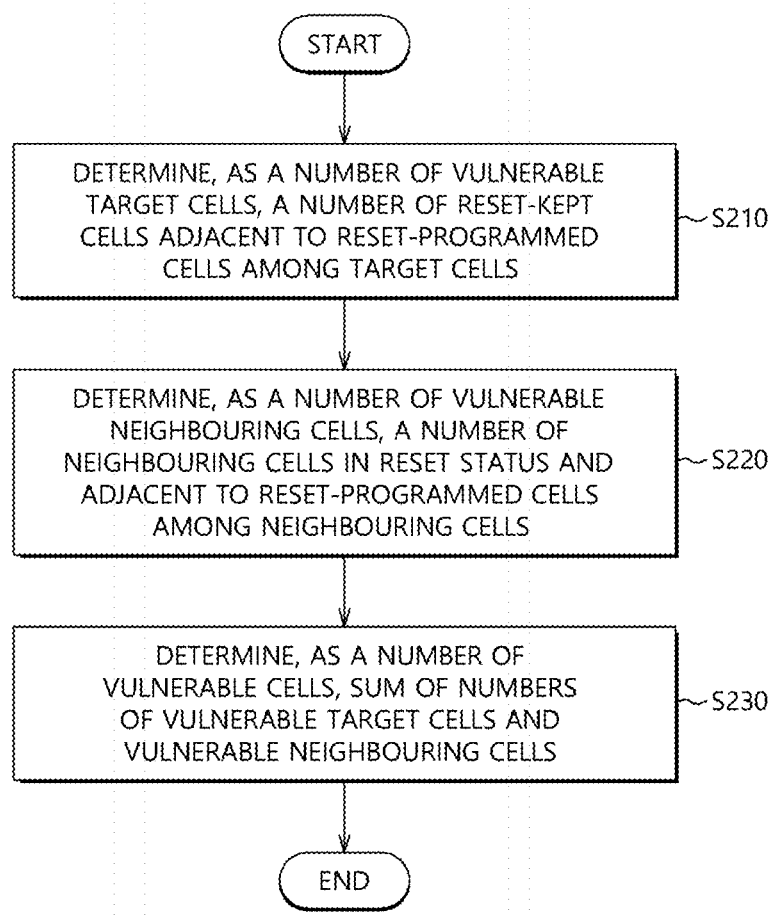
FIG. 7 illustrates an operating process of the controller of FIG. 1 in accordance with an embodiment.

FIG. 7 is a flowchart illustrating an operating process of the controller 100 of FIG. 1 in accordance with an embodiment. FIG. 7 illustrates an embodiment of step S120 of FIG. 6.

Referring to FIG. 7, in step S210, for each of the plurality of candidate data sets CDT1 to CDTk, the controller 110 may determine, as the respective number of vulnerable target cells WTCN, a number of the reset-kept cells adjacent to the reset-programmed cells among the target cells within the target memory region TMR.

In step S220, for each of the plurality of candidate data sets CDT1 to CDTk, the controller 110 may determine, as the respective number of vulnerable neighbouring cells WACN, a number of the neighbouring cells in the reset status and adjacent to the reset-programmed cells within the target memory region TMR among the neighbouring cells within the neighbouring memory regions AMR1 and AMR2 shown in FIG. 1.

In step S230, for each of the plurality of candidate data sets CDT1 to CDTk, the controller 110 may determine, as the respective number of vulnerable cells WCN, the sum of the respective number of vulnerable target cells WTCN and the respective number of vulnerable neighbouring cells WACN.

Figure 8:
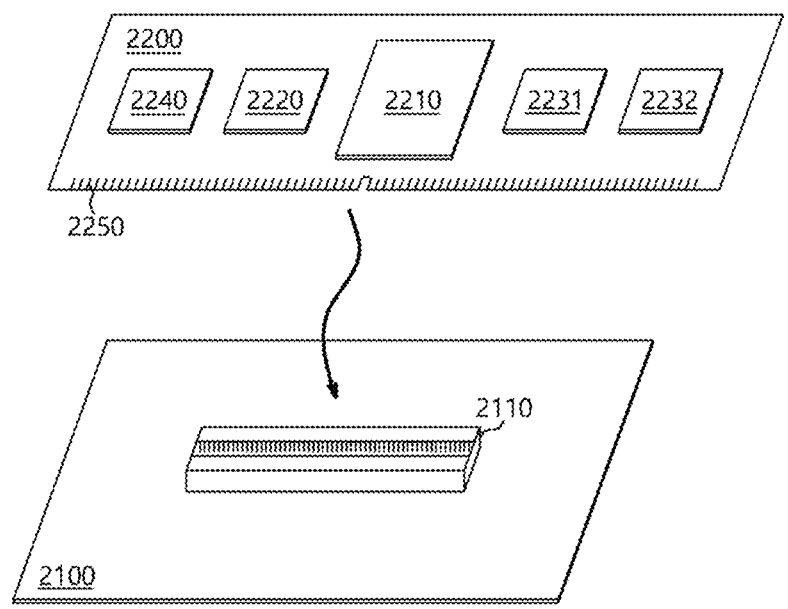
FIG. 8 illustrates a data processing system including a memory system in accordance with an embodiment.

FIG. 8 is a diagram illustrating a data processing system 2000 including a memory system 2200 in accordance with an embodiment. Referring to FIG. 8, the data processing system 2000 may include a host device 2100 and the memory system 2200.

The host device 2100 may be configured in the form of a board such as a printed circuit board. Although not shown, the host device 2100 may include internal function blocks for performing the function of a host device.

The host device 2100 may include a connection terminal 2110 such as a socket, a slot or a connector. The memory system 2200 may be mounted to the connection terminal 2110.

The memory system 2200 may be configured in the form of a board such as a printed circuit board. The memory system 2200 may be referred to as a memory module or a memory card. The memory system 2200 may include a controller 2210, a buffer memory device 2220, nonvolatile memory devices 2231 and 2232, a power management integrated circuit (PMIC) 2240, and a connection terminal 2250.

The controller 2210 may control general operations of the memory system 2200. The controller 2210 may be configured to operate in the same manner as the controller 110 shown in FIG. 1.

The buffer memory device 2220 may temporarily store data to be stored in the nonvolatile memory devices 2231 and 2232. Further, the buffer memory device 2220 may temporarily store the data read from the nonvolatile memory devices 2231 and 2232. The data temporarily stored in the buffer memory device 2220 may be transmitted to the host device 2100 or the nonvolatile memory devices 2231 and 2232 according to control of the controller 2210.

The nonvolatile memory devices 2231 and 2232 may be used as storage media of the memory system 2200.

The PMIC 2240 may provide the power inputted through the connection terminal 2250, to the inside of the memory system 2200. The PMIC 2240 may manage the power of the memory system 2200 according to control of the controller 2210.

The connection terminal 2250 may be coupled to the connection terminal 2110 of the host device 2100. Through the connection terminal 2250, signals such as commands, addresses, data and so forth and power may be transferred between the host device 2100 and the memory system 2200. The connection terminal 2250 may be configured into various types depending on an interface scheme between the host device 2100 and the memory system 2200. The connection terminal 2250 may be disposed on any one side of the memory system 2200.

Figure 9:
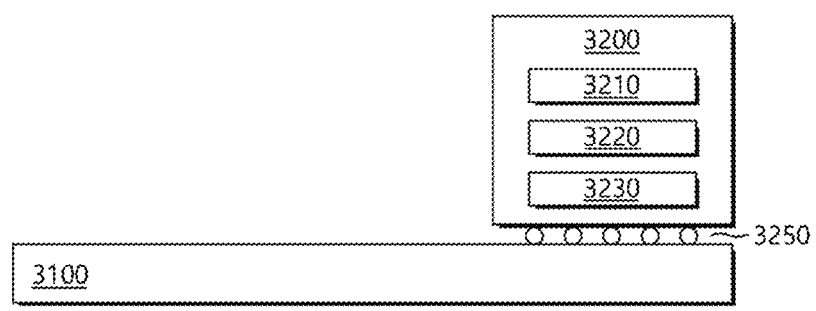
FIG. 9 illustrates a data processing system including a memory system in accordance with an embodiment.

FIG. 9 is a diagram illustrating a data processing system 3000 including a memory system 3200 in accordance with an embodiment. Referring to FIG. 9, the data processing system 3000 may include a host device 3100 and the memory system 3200.

The host device 3100 may be configured in the form of a board such as a printed circuit board. Although not shown, the host device 3100 may include internal function blocks for performing the function of a host device.

The memory system 3200 may be configured in the form of a surface-mounting type package. The memory system 3200 may be mounted to the host device 3100 through solder balls 3250. The memory system 3200 may include a controller 3210, a buffer memory device 3220, and a nonvolatile memory device 3230.

The controller 3210 may control general operations of the memory system 3200. The controller 3210 may be configured to perform in the same manner as the controller 110 shown in FIG. 1.

The buffer memory device 3220 may temporarily store data to be stored in the nonvolatile memory device 3230. Further, the buffer memory device 3220 may temporarily store the data read from the nonvolatile memory device 3230. The data temporarily stored in the buffer memory device 3220 may be transmitted to the host device 3100 or the nonvolatile memory device 3230 according to control of the controller 3210.

The nonvolatile memory device 3230 may be used as the storage medium of the memory system 3200.

Figure 10:
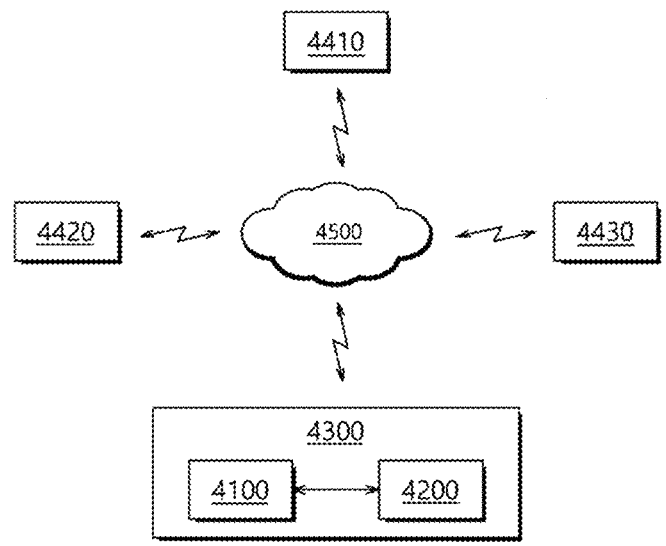
FIG. 10 illustrates a network system including a memory system in accordance with an embodiment.

FIG. 10 is a diagram illustrating a network system 4000 including a memory system 4200 in accordance with an embodiment. Referring to FIG. 10, the network system 4000 may include a server system 4300 and a plurality of client systems 4410 to 4430 which are coupled through a network 4500.

The server system 4300 may service data in response to requests from the plurality of client systems 4410 to 4430. For example, the server system 4300 may store the data provided from the plurality of client systems 4410 to 4430. For another example, the server system 4300 may provide data to the plurality of client systems 4410 to 4430.

The server system 4300 may include a host device 4100 and the memory system 4200. The memory system 4200 may be configured by the memory system 100 shown in FIG. 1, the memory system 2200 shown in FIG. 8 or the memory system 3200 shown in FIG. 9.

Figure 11:
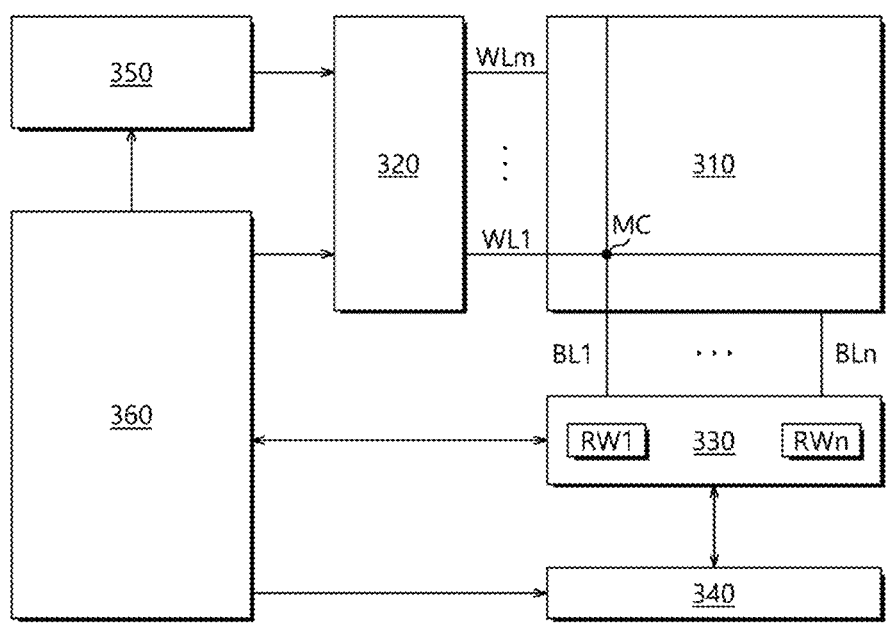
FIG. 11 illustrates a nonvolatile memory device included in a memory system in accordance with an embodiment.

FIG. 11 is a block diagram illustrating a nonvolatile memory device 300 included in a memory system in accordance with an embodiment. Referring to FIG. 11, the nonvolatile memory device 300 may include a memory cell array 310, a row decoder 320, a data read/write block 330, a column decoder 340, a voltage generator 350, and a control logic 360.

The memory cell array 310 may include memory cells MC which are arranged at areas where word lines WL1 to WLm and bit lines BL1 to BLn intersect with each other.

The row decoder 320 may be coupled with the memory cell array 310 through the word lines WL1 to WLm. The row decoder 320 may operate according to control of the control logic 360. The row decoder 320 may decode an address provided from an external device (not shown). The row decoder 320 may select and drive the word lines WL1 to WLm, based on a decoding result. For instance, the row decoder 320 may provide a word line voltage provided from the voltage generator 350, to the word lines WL1 to WLm.

The data read/write block 330 may be coupled with the memory cell array 310 through the bit lines BL1 to BLn. The data read/write block 330 may include read/write circuits RW1 to RWn respectively corresponding to the bit lines BL1 to BLn. The data read/write block 330 may operate according to control of the control logic 360. The data read/write block 330 may operate as a write driver or a sense amplifier according to an operation mode. For example, the data read/write block 330 may operate as a write driver which stores data provided from the external device, in the memory cell array 310 in a write operation. For another example, the data read/write block 330 may operate as a sense amplifier which reads out data from the memory cell array 310 in a read operation.

The column decoder 340 may operate according to control of the control logic 360. The column decoder 340 may decode an address provided from the external device. The column decoder 340 may couple the read/write circuits RW1 to RWn of the data read/write block 330 respectively corresponding to the bit lines BL1 to BLn with data input/output lines or data input/output buffers, based on a decoding result.

The voltage generator 350 may generate voltages to be used in internal operations of the nonvolatile memory device 300. The voltages generated by the voltage generator 350 may be applied to the memory cells of the memory cell array 310. For example, a program voltage generated in a program operation may be applied to a word line of memory cells for which the program operation is to be performed. For another example, an erase voltage generated in an erase operation may be applied to a well area of memory cells for which the erase operation is to be performed. For still another example, a read voltage generated in a read operation may be applied to a word line of memory cells for which the read operation is to be performed.

The control logic 360 may control general operations of the nonvolatile memory device 300, based on control signals provided from the external device. For example, the control logic 360 may control operations of the nonvolatile memory device 300 such as read, write and erase operations of the nonvolatile memory device 300.

While certain embodiments have been described above, it will be understood to those skilled in the art that the embodiments described are by way of example only. Accordingly, the memory system and operating method thereof should not be limited based on the described embodiments. Rather, the memory system and operating method thereof described herein should only be limited in light of the claims that follow when taken in conjunction with the above description and accompanying drawings.

What is claimed is:

1. A memory system comprising:
a non-volatile memory device including a plurality of memory regions, each memory region including a plurality of cells commonly coupled to a word line; and
a controller configured to:
generate a plurality of candidate data sets based on source data,
determine a respective number of vulnerable cells corresponding to each of the plurality of candidate data sets,
select, from the plurality of candidate data sets, a candidate data set having a smallest number of vulnerable cells, and
store the selected candidate data set into a target memory region among the plurality of memory regions.

2. The memory system of claim 1, wherein determining the number of vulnerable cells corresponding to a candidate data set comprises:
determine a number of vulnerable target cells according to the candidate data set within the target memory region,
determine a number of vulnerable neighbouring cells according to the candidate data set within at least one neighbouring memory region adjacent to the target memory region, and
determine a sum of the number of vulnerable target cells and the number of vulnerable neighbouring cells as the number of vulnerable cells of the candidate data set.

3. The memory system of claim 2, wherein determining the number of vulnerable target cells includes determining, as the number of vulnerable target cells, a number of reset-kept cells corresponding to the candidate data set adjacent to reset-programmed cells corresponding to the candidate data set among target cells within the target memory region.

4. The memory system of claim 3, wherein the controller is configured to determine a target cell that would be kept in a reset status when the candidate data set is stored as a reset-kept cell corresponding to the candidate data set, and to determine a target cell that would be changed from a set status to the reset status when the candidate data set is stored as a reset-programmed cell corresponding to the candidate data set.

5. The memory system of claim 3, wherein determining the number of vulnerable target cells is based on the candidate data set and a target data set that is read from the target memory region.

6. The memory system of claim 3, wherein determining the number of vulnerable neighbouring cells includes determining, as the number of vulnerable neighbouring cells, a number of neighbouring cells among neighbouring cells within the at least one neighbouring memory region in a reset status and adjacent to the reset-programmed cells corresponding to the candidate data set.

7. The memory system of claim 6, wherein determining the number of vulnerable neighbouring cells is based on a target data set read from the target memory region, at least one neighbouring data set read from the at least one neighbouring memory region, and the candidate data set.

8. The memory system of claim 1, wherein generating the plurality of candidate data sets comprises generating the plurality of candidate data sets by encoding the source data according to coset coding.

9. A memory system comprising:
a phase-change memory device including a plurality of memory regions; and
a controller configured to:
generate a candidate data set based on source data,
determine a number of vulnerable cells corresponding to the candidate data set based on a target data set that is read from a target memory region among the plurality of memory regions, at least one neighbouring data set read from at least one neighbouring memory region and the candidate data set, and
selectively store the candidate data set into the target memory region based on the number of vulnerable cells.

10. The memory system of claim 9, wherein determining the number of vulnerable cells comprises:
determining, as a number of vulnerable target cells, a number of reset-kept cells adjacent to reset-programmed cells among target cells within the target memory region based on the target data set and the candidate data set, determining, as a number of vulnerable neighbouring cells, a number of neighbouring cells in a reset status and adjacent to the reset-programmed cells among neighbouring cells within the at least one neighbouring memory region based on the at least one neighbouring data set, and determining a sum of the number of vulnerable target cells and the number of vulnerable neighbouring cells as the number of vulnerable cells.

11. The memory system of claim 9, wherein generating the candidate data set comprises generating the candidate data set by encoding the source data according to coset coding.

12. A method of operating a memory system including a non-volatile memory device including a plurality of memory regions each including a plurality of cells commonly coupled to a word line, the method comprising:

generating, by a controller, a plurality of candidate data sets based on source data;

determining, by the controller, a respective number of vulnerable cells corresponding to each of the plurality of candidate data sets; and storing, by the controller, a candidate data set having a smallest number of vulnerable cells into a target memory region among the plurality of memory regions.

13. The method of claim 12, wherein determining a number of vulnerable cells corresponding to a candidate data set includes:

determining a number of vulnerable target cells within the target memory region;

determining a number of vulnerable neighbouring cells within at least one neighbouring memory region adjacent to the target memory region; and determining a sum of the number of vulnerable target cells and the number of vulnerable neighbouring cells as the number of vulnerable cells.

14. The method of claim 13, wherein determining the number of vulnerable target cells includes:

determining, according to the candidate date set, one or more reset-programmed cells among target cells within the target memory region; and determining as the number of vulnerable target cells a number of reset-kept cells within the target memory region that are adjacent to at least one of the reset-programmed cells.

15. The method of claim 14, wherein determining the number of vulnerable target cells includes:

determining a target cell to be kept in a reset status among the target cells when the candidate data set is stored as a reset-kept cell, and determining a target cell to be changed from a set status to the reset status among the target cells when the candidate data set is stored as a reset-programmed cell.

16. The method of claim 14, wherein determining the number of vulnerable target cells includes determining the number of vulnerable target cells based on the candidate data set and a target data set that is read from the target memory region.

17. The method of claim 14, wherein determining the number of vulnerable neighbouring cells includes determining as the number of vulnerable neighbouring cells a number of neighbouring cells in a reset status and adjacent to the reset-programmed cells among neighbouring cells within the at least one neighbouring memory region.

18. The method of claim 17, wherein determining the number of vulnerable neighbouring cells includes determining the number of vulnerable neighbouring cells of a candidate data set based on a target data set read from the target memory region, at least one neighbouring data set read from the at least one neighbouring memory region, and the candidate data set.

19. The method of claim 12, wherein generating the plurality of candidate data sets includes generating the plurality of candidate data sets by encoding the source data according to coset coding.

* * * * *